United States Patent [19]

Ohsawa et al.

[11] Patent Number: 5,285,354
[45] Date of Patent: Feb. 8, 1994

[54] BASE UNIT FOR CONTROLLER

[75] Inventors: Osamu Ohsawa; Noboru Takahashi, both of Aichi, Japan

[73] Assignee: Mitsubishi Denki K.K., Tokyo, Japan

[21] Appl. No.: 838,840

[22] Filed: Feb. 21, 1992

[30] Foreign Application Priority Data

Feb. 28, 1991 [JP] Japan .................................. 3-034334

[51] Int. Cl.⁵ .............................................. H05K 5/00
[52] U.S. Cl. ..................... 361/752; 361/707; 361/715; 361/823; 439/67; 439/77
[58] Field of Search ............... 361/383, 384, 388, 389, 361/392-395, 399, 415, 417, 419, 413, 426, 427, 420; 439/76, 77, 78, 74, 75, 67; 174/255

[56] References Cited

U.S. PATENT DOCUMENTS

| | | | |
|---|---|---|---|
| 4,987,516 | 1/1991 | Belanger, Jr. et al. | 361/413 |
| 5,124,888 | 6/1992 | Suzuki et al. | 361/395 |
| 5,166,862 | 11/1992 | Durivage, III et al. | 361/383 |

Primary Examiner—Lincoln Donovan
Assistant Examiner—Young Whang
Attorney, Agent, or Firm—Sughrue, Mion, Zinn, Macpeak & Seas

[57] ABSTRACT

A controller base unit for a DIN-standard installation wherein a molded base is provided with an internal chassis for support and a contour that permits the direct and releasable attachment of the unit to a DIN rail via a plurality of hooks that are simultaneously moveable between an engaged and non-engaged position. The base is provided with a recess in a planar face thereof for accommodating a printed circuit board and has fixed tabs along the periphery of the recess. The circuit board has cut-outs that mate with the tabs for insertion of the board into the recess and is slidable laterally into a position where the tabs secure the board against the surface of the recess and a screw or the like can secure the board against further lateral movement. The board has at both ends thereof a pair of connectors that are connectable with either end of a separate similarly designed board via a cable. With this board design, the length of cable connections between boards arranged horizontally, vertically, side-by-side, etc. can be minimized.

15 Claims, 8 Drawing Sheets

BASE UNIT FOR CONTROLLER

BACKGROUND OF THE INVENTION

1. Field of the Invention

The present invention relates to controller base units for accommodating modules which have been modularized by function.

2. Description of the Background Art

FIG. 8 is a perspective view of a controller base unit known in the art for accommodating modules modularized on a function basis, e.g. a power supply module, a CPU module and I/O modules, in a programmable controller employed as a controller. FIG. 9 is a sectional view taken along the plane 9—9 of FIG. 8, and FIG. 10 a sectional view of the portion X of FIG. 8.

Referring to FIGS. 8, 9 and 10, a base unit 25 comprises a chassis 26 and a printed circuit board 27. The chassis 26 is a rectangular steel plate having a recess for accommodating the printed circuit board 27, as shown in FIG. 9, and panel mounting holes 8 formed at the four corners of the chassis. The printed circuit board 27 includes an external connector 18 for connection of the base unit 25 to an extension base unit 30, described later; board 27 is installed in a recess of the chassis 26, as shown in FIG. 8. The chassis 26 and printed circuit board 27 are secured by installation screws 7, as shown in FIG. 10. Numerous installation screws 7 are required to securely join the chassis 26 and printed circuit board 27.

FIG. 11 is a perspective view of a module 28 known in the art, having a DIN (Deutches Institut fur Normung) standard rail groove 9 for installation onto a DIN-standard rail. The module is made of a non-conductive material that provides protection for internal circuit components on a controller base unit and permits a non-conductive connection of the module to the DIN-standard rail. Hooks 29 on the module 28 are operative for installation of the module to and removal from the DIN-standard rail, each hook providing a single engagement with the rail. Screw holes 28B in the module 28 permit an optional panel mount of the module. The module 28 is an improvement over the base unit type controller shown in FIG. 8, which does not have a rail-mounting capability due to the cost of machining the base unit 26 and the conductive contact that would exist between the base unit 26 and the DIN-standard rail. The base unit 25 would be installed in the module 28 to provide desired controller functions.

FIG. 12 is a sectional view taken along the plane 12—12 of FIG. 11, wherein 13 indicates a tool. Referring to FIG. 12, a right-hand end of a hook 29 accepts the tip of the tool 13 and is provided with a recessed step. The tool 13 can not extend through the hook 29 but can be moved from side-to-side on the drawing (as indicated by the arrows), using the corner 28A of the module 28 as a support. The module 28 is kept pressed toward the DIN rail, i.e. to the left, by springs (not shown). The module 28 is released from the DIN rail when the hook 29 is moved to the right by the tool 13 and is secured in its original position when the tool 13 is released from the hook 29.

FIG. 13, FIG. 14 and FIG. 15 show examples of arrangements of the base unit 25 and an extension base unit 30, which has no independent power supply module. FIG. 13 is a vertical installation arrangement diagram, FIG. 14 is a horizontal installation arrangement diagram and FIG. 15 is an arrangement where horizontal and vertical installations are mixed. In the Figures, "PW" indicates a conventional power supply module, "CPU" a conventional CPU module, "I/O" a conventional I/O module, and 23 and 31 conventional power/signal cables.

Referring to FIG. 13, only the printed circuit board 27 includes a PW module and a CPU module, no such modules are on the extension base unit 30. The PW of the board 27 outputs to 0V and 5V power supply line patterns and the CPU connects to signal line patterns. The power and signal lines extend on the board 27 to an I/O module and an external connector 18, designed for connection to the cable 23. The extension base unit 30 has no PW or CPU but does have I/O modules with I/O connectors and external connectors 21A and 21B. Conventionally, both of the external connectors 21A and 21B on the extension base unit 30 are on one side of the unit, as shown. As in the base unit 25, the extension base unit 30 has similar power and signal line patterns extending among its connectors 21A, 21B and I/O connectors.

The base unit 25 and extension base unit 30 are connected by the cable 23, extending from the external connector 18 to the external connector 21A.

FIG. 14 shows an embodiment of the horizontal arrangement of the base unit 25 and extension base unit 30, wherein the base unit 25 and extension base unit 30 are connected by a cable 31 extending from external connector 18 to connector 21A.

FIG. 15 shows an example where extension base units 30 are both horizontally and vertically installed. Base unit 25 and a first of several extension base units 30 are connected by a cable 31 which extends from the external connector 18 to external connector 21A. Extension base units 30 may be connected with each other by cable 31, extending from an external connector 21B to the external connector 21A of the next horizontal extension base unit. A vertical connection may be made by a long cable 31A or a short cable 23 from connector 21B of one unit to connector 21A of another unit.

The background art arranged as described above has the following disadvantages:

1. The chassis 26 is made of steel plate and has limited accuracy of shape, dimensions, etc.

2. The base unit 25 is built for panel mounting only and is not suitably designed for both panel mounting and DIN rail mounting because the chassis 26 is made of steel plate. DIN rail mounting is possible only with a DIN-standard module 28.

3. A DIN-standard module 28 may require more than two hooks 29 for a secure but releasable attachment to the DIN rail. However, if more hooks are added, it becomes extremely difficult to unlatch a plurality of hooks 29 conveniently.

4. The installation and removal of the printed circuit board 27 to and from the base unit 25 requires a relatively large number of steps because of the many installation screws 7.

5. For the I/O modules installed on the extension base unit 30 and supplied from the power supply module installed on the base unit 25, a voltage drop (cable resistance x suppression of currents consumed by the I/O modules of an extension base unit 30) exists across the cable 31, which is long in the horizontal arrangement. The voltage drop cannot be ignored and prevents the use on the extension base unit 30 of I/O modules having a large current consumption.

It is accordingly an object of the present invention to overcome the disadvantages in the background art by providing a controller base unit designed both for panel mounting and DIN rail mounting.

It is a further object of the present invention to provide ease of installation to a panel and installation/removal to/from a DIN-standard rail.

It is yet another object of the invention to provide the design of a printed circuit board and chassis that are easily assembled.

An additional object of the invention is to provide a design for an extension base units that are connectable by employing comparatively short cable.

SUMMARY OF THE INVENTION

A first embodiment of the invention achieves a base unit which is durable against warp and twist and does not give rise to cracks and shape changes due to temperature variations. The base unit comprises a chassis and a mold base for holding the chassis, the chassis has through holes for holding the mold base integrally therewith, and the mold base has transverse stress-slits which separate the mold base into a plurality of pieces.

A second embodiment of the invention achieves a base unit which can be employed both for panel mounting and DIN-standard rail mounting. The rear surface of the mold base has a DIN rail groove formed for installation onto the DIN rail and is provided with DIN rail installation/removal hooks for installably/removably fixing the base unit to the DIN rail and with elastic means for slidably pressing the DIN rail installation/removal hooks against the DIN rail.

A third embodiment of the invention achieves a base unit which is freely installable onto and removable from the DIN rail. A tool-through hole is formed adjacent to a projection that protrudes externally from the side face of the mold base and is attached to a plurality of the DIN rail installation/removal hooks. The projection is for pulling plural hooks away from the DIN rail, against the elastic force of elastic means which presses the plural DIN rail installation/removal hooks against the DIN rail.

A fourth embodiment of the invention achieves a base unit which allows a printed circuit board to be secured to the mold base with a relatively small number of screws. Tabs, which correspond to cutouts provided in the printed circuit board, are formed in the periphery of a recess that is provided in the front surface of the mold base and accommodates the printed circuit board. A clearance, which permits the printed circuit board to slide laterally and become secured by a force on the board, is provided between the tabs and the surface of the printed circuit board. Alternatively, the tabs may be located on the board and the cutouts on the base, or combinations of both structures may be used.

A fifth embodiment of the present invention achieves a base unit which allows the use of shorter cables for connection with other base units, whether or not the other units are placed at horizontal and/or vertical locations. To this end a pair of external connectors, each adjacent to an opposite end of the surface of the printed circuit board that is mounted on the front surface of the mold base, are provided for connection to the power and signal line patterns on the board.

DESCRIPTION OF THE PREFERRED EMBODIMENTS

Figure 1:
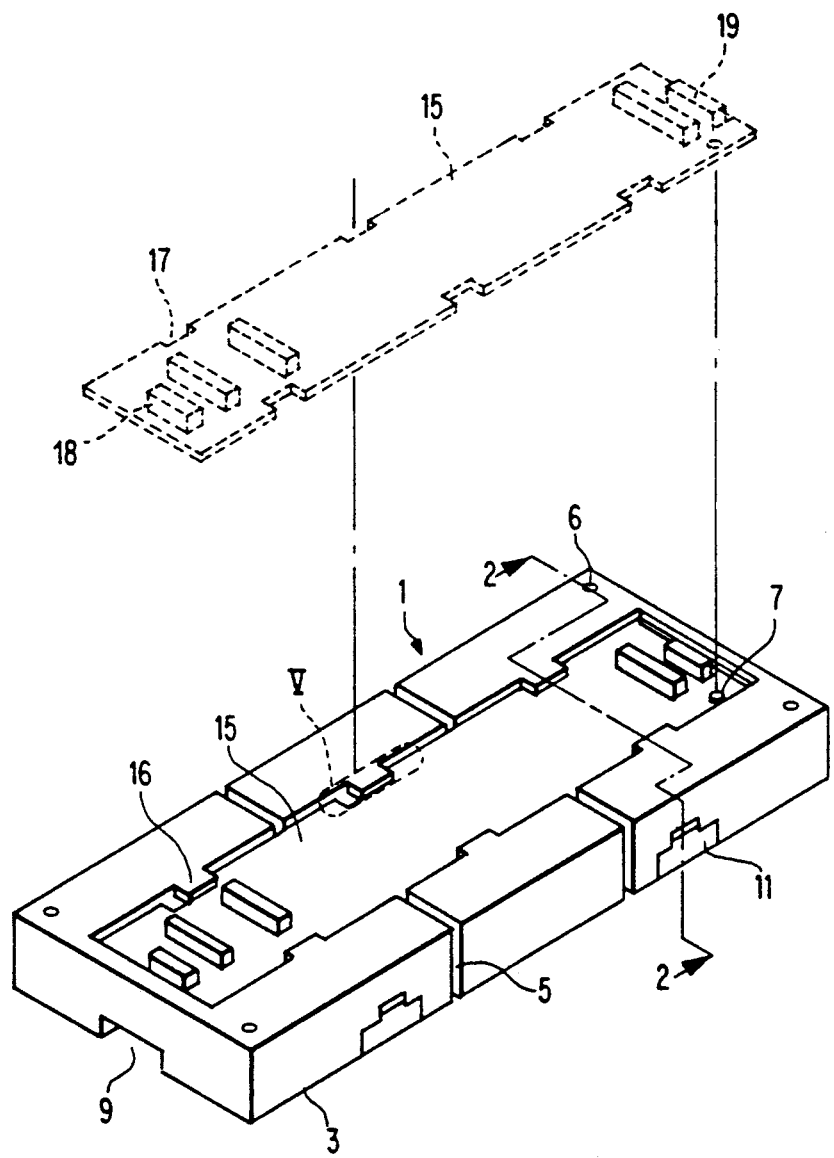
FIG. 1 is a perspective view of a base unit according to all embodiments of the invention.

A first embodiment of the invention will now be described with reference to FIG. 1 to FIG. 5, wherein reference characters employed in the background art indicate identical or corresponding parts.

FIG. 1 is a perspective view of a base unit in accordance with the first embodiment of the present invention, wherein the numeral 1 indicates a base unit, 3 a mold base, 5 slits provided in the mold base 3, 6 panel mounting holes, 7 an installation screw for installing a later-described printed circuit board 15 to the mold base 3, 9 a DIN-standard rail groove for installation to a later-described DIN-standard rail.-10, 11 a hook assembly for securing, installing and removing the base unit 1 to and from the later-described DIN rail 10, 15 a printed circuit board, 16 tabs provided in the mold base 3 for securing the printed circuit board 15, 17 cutouts of the printed circuit board 15 fitting the tabs 16, and 18 and 19 extension connectors, respectively, for connection with a later-described extension base unit 20 that is disposed separately.

Figure 2:
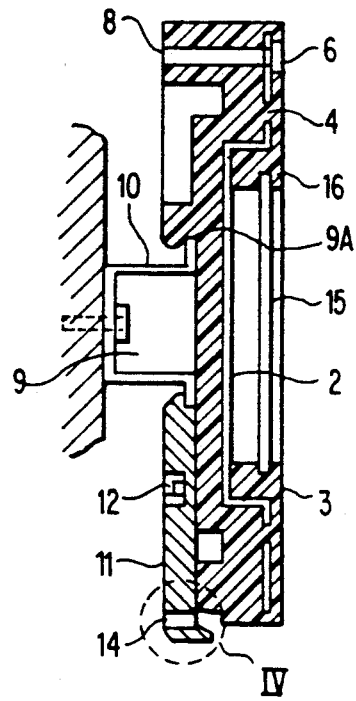
FIG. 2 is a sectional view taken along the plane 2-2 of FIG. 1.

FIG. 2 is a sectional view taken along the plane 2—2 of FIG. 1, wherein 2 indicates a chassis covered with the mold base 3, 4 mold joining holes in the chassis 2 for structurally integrating the chassis 2 to the mold base 3, 8 panel mounting holes, 10 a DIN-standard rail, 12 a spring wire affixed to the hook assembly 11, and 14 a through hole provided in the hook assembly 11. Preferably, the chassis 2 is made from a rectangular sheet that is bent at a plurality of places and is covered with the mold base 3. Chassis 2 has mold joining holes 4 in several distributed positions. The mold base 3 and chassis 2 are integrally molded, with the chassis 2 surrounded by the mold base material and securely joined thereto via the holes 4 in the chassis 2. The mold base may be made of a non-conductive plastic, epoxy, etc. material, which has a coefficient of thermal expansion greater than steel or other selected chassis material.

Referring to FIG. 1, because the mold base 3 has a greater coefficient of thermal expansion than the chassis 2, it is provided with one or more transverse slits 5 that may penetrate to the chassis. The slits serve as gaps for separating the mold base 3 into a plurality of pieces, thereby preventing undesired shape and dimensional changes of the base unit 1 due to the effect of temperature variations on the integrated base and chassis materials.

The panel mounting hole 6 provided in each of the four corners of the base unit 1 is equivalent to the external shape of a screw head and the mounting hole 8 is equivalent to the diameter of a screw. The chassis 2 is supported by the mold base 3 to prevent distortion caused by screw tightening pressure in the rear periphery of the mounting holes 8 in the chassis 2. By the same token, the chassis 2 provides support to the interface of the base material and the metal DIN rail.

Figure 3:
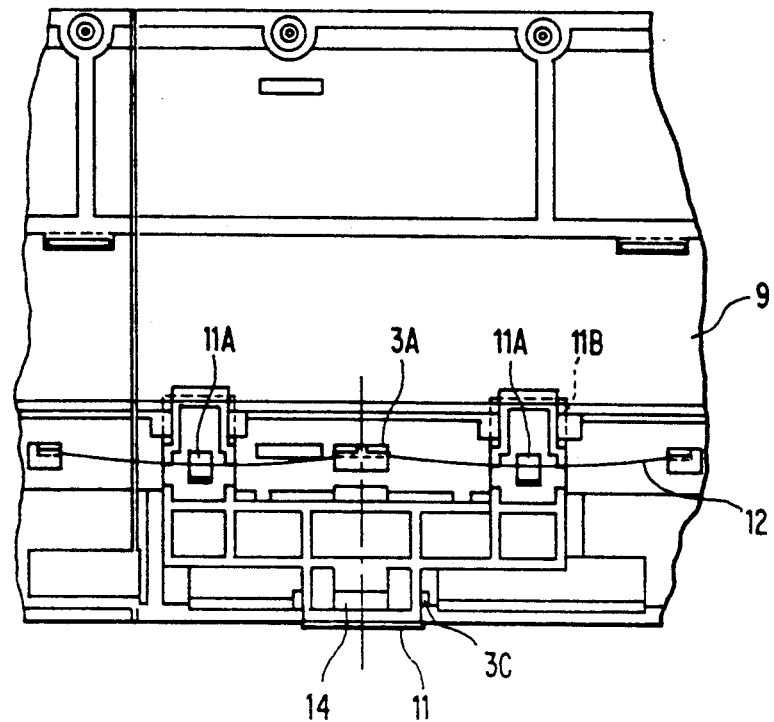
FIG. 3 illustrates a hook that is shown in FIG. 2 and is employed for installation to and removal from a DIN rail.

FIG. 3 illustrates the hook assembly 11 in FIG. 2, as viewed from the rear surface of the mold base 3. Referring to FIG. 3, 3A indicates a spring wire 12 fixing portion formed in the back of the mold base 3, 3B and 3C indicate sliding grooves for hook assembly 11 that are formed in the back of the mold base 3, and 11A indicates engagements for spring wire 12 that are formed in the hook assembly 11. As can be seen in the Figure, the spring wire 12 presses the hook assembly 11 toward the DIN rail 10 via the engagements 11A. As seen in FIG. 3, the rear face of the mold base 3 is provided with a U-shaped DIN rail groove 9 for installation to the DIN rail 10. The groove 9 comprises a catch 9A that is built into the mold base 3 and is designed to hang on the DIN rail 10 at the top. Engaging the bottom of the DIN rail are two or more hooks 11B, which are vertically moveable between an engaging and a non-engaging position by force of the spring wire 12, and act to securely hold the base to the rail.

Figure 4:
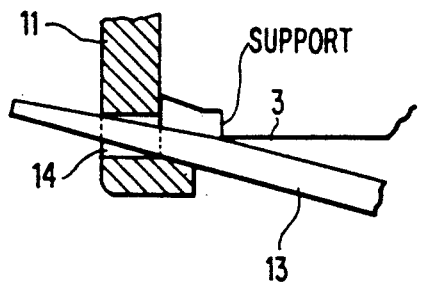
FIG. 4 is a detail view of the portion IV of FIG. 2.

FIG. 4 is a detail view showing the portion IV of FIG. 2, wherein 13 indicates a tool placed in the through hole 14 of the hook assembly 11 for purposes of applying a force to the spring wire 12.

The through hole 14 for passing the tip of the tool is provided in the bottom of the hook assembly 11, shown in FIG. 2. As shown in FIG. 4, the tool 13 is inserted into the through hole 14 with the corner of the mold base 3 employed as a support. When the tool 13 is further inserted, the hook assembly 11 moves downward in the Figure and the plurality of hooks 11B are released from the DIN rail 10. Clearly, when in this position, the load of the portion projecting from the hook 11 is directed downward. When that load becomes larger than the load of the mold base 3 at the corner support, the tool 13 may be retained in place.

Figure 5:
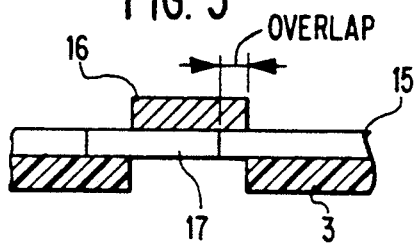
FIG. 5 is a sectional view of the portion V of FIG. 1.

FIG. 5 is a sectional view illustrating the portion B of FIG. 1. The printed circuit board 15 in FIG. 1 has a plurality of cutouts 17 in specific locations. The mold base 3 has a rectangular recess for accommodating the printed circuit board 15 and also tabs 16 in locations that correspond to the cutouts 17 of the printed circuit board 15.

As shown in the portion V of FIG. 1, the printed circuit board 15 is installed from the top, with the tabs 16 of the mold base 3 matched and fitted with the cutouts 17, and is then slid to the side. FIG. 5 shows the arrangement for an installed circuit board wherein the cutout 17 of the printed circuit board 15 is offset to the left from the tab 16 and the right-hand end of the tab 16 is lapped over a part of the printed circuit board 15, whereby the tab 16 serves to keep the printed circuit board 15 from coming out in an upward direction. The single installation screw 7 in FIG. 1 is provided for securing the printed circuit board 15, preventing sideways movement. Alternatively, the tabs may appear on the circuit board and may mate with corresponding cut-outs in the mold, or combinations of both may be used.

Figure 6:
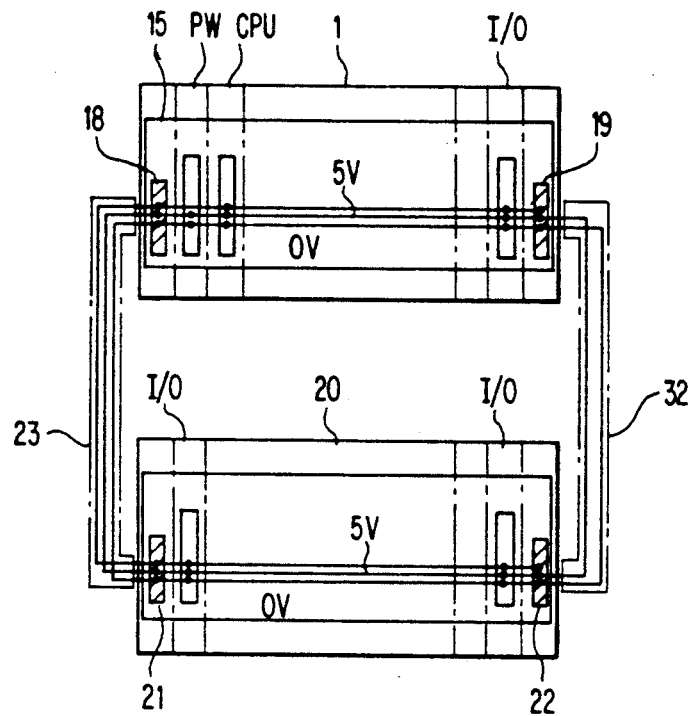
FIG. 6 shows cable connection in the vertical arrangement of the base unit and an extension base unit according to one embodiment of the invention.
Figure 7A:
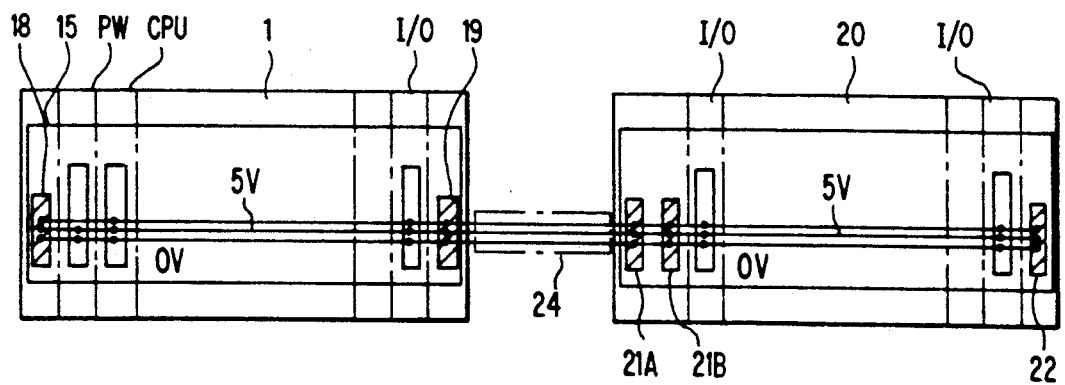
FIG. 7A shows a cable connection in the horizontal arrangement of the base unit and the extension base unit according to one embodiment of the invention.
Figure 7B:
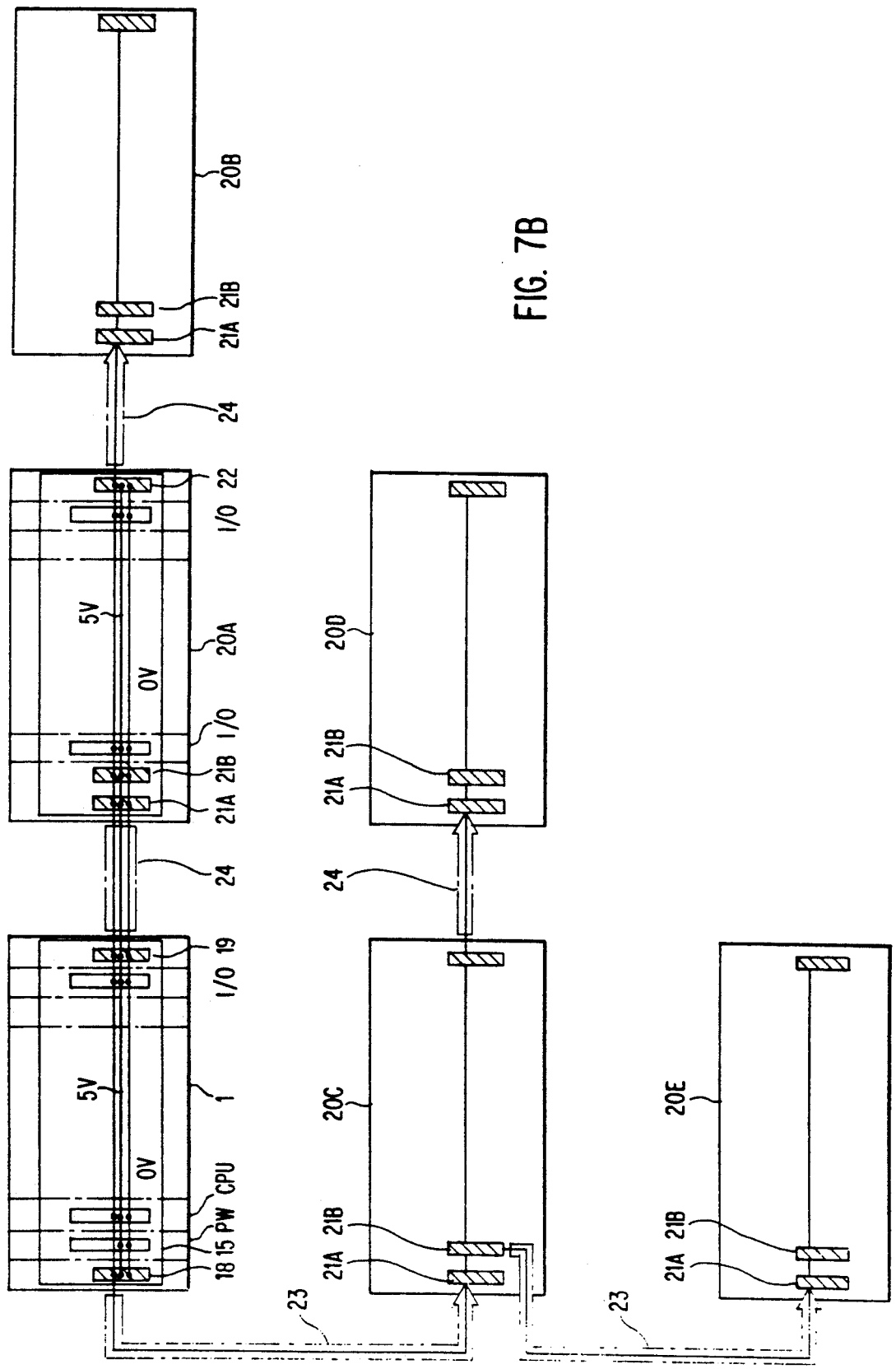
FIG. 7B shows a cable connection in which extension base units are horizontally and vertically installed according to one embodiment of the invention.
Figure 8:
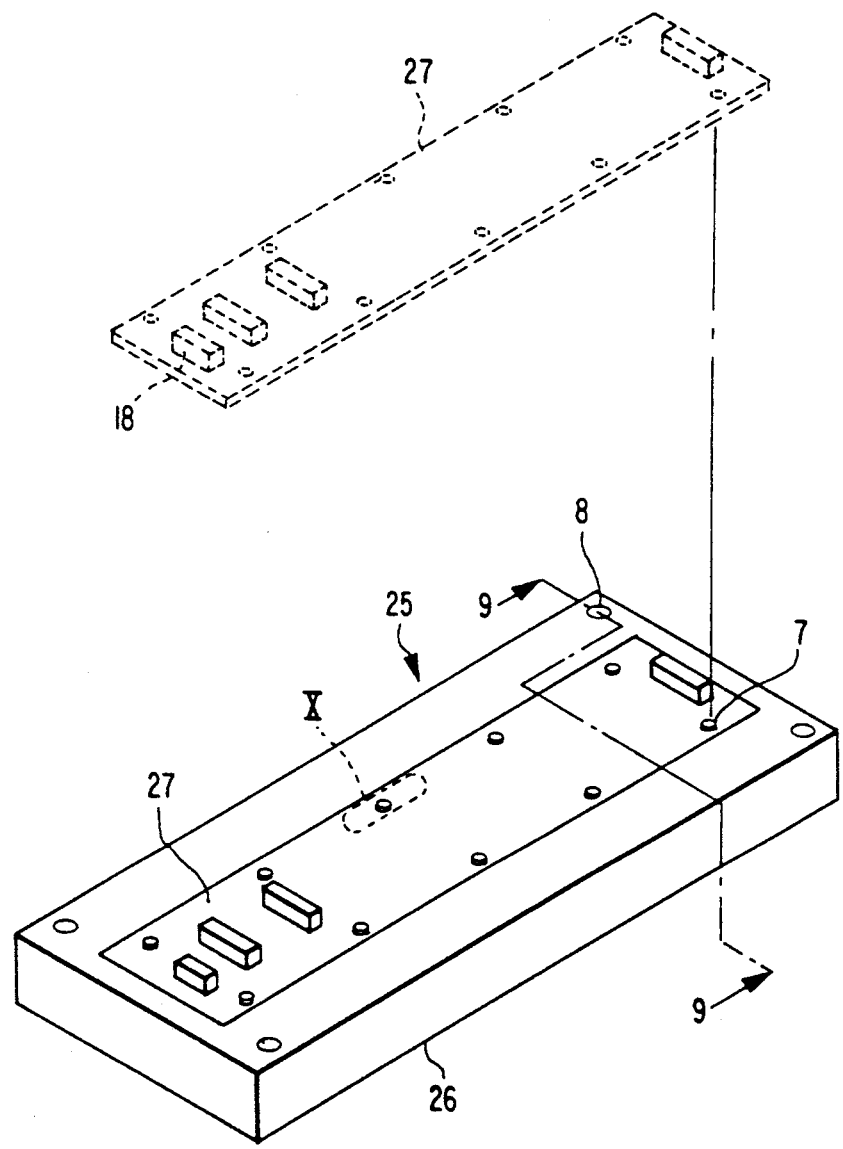
FIG. 8 is a perspective view of a base unit known in the art.
Figure 9:
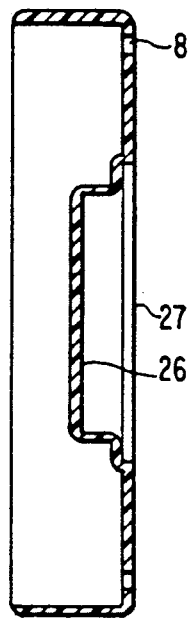
FIG. 9 is a sectional view taken along the plane 9—9 of FIG. 8.
Figure 10:
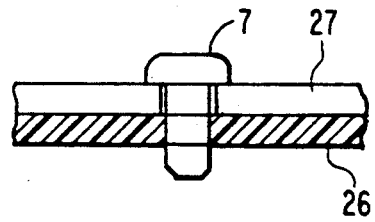
FIG. 10 is a detail view of the portion X of FIG. 8.
Figure 12:
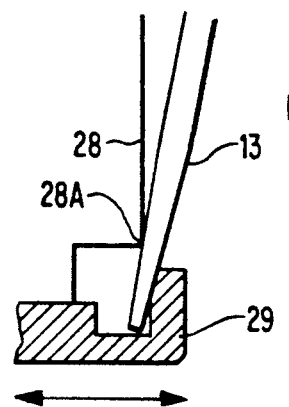
FIG. 12 is a sectional view taken along the plane 12—12 of FIG. 10.
Figure 11:
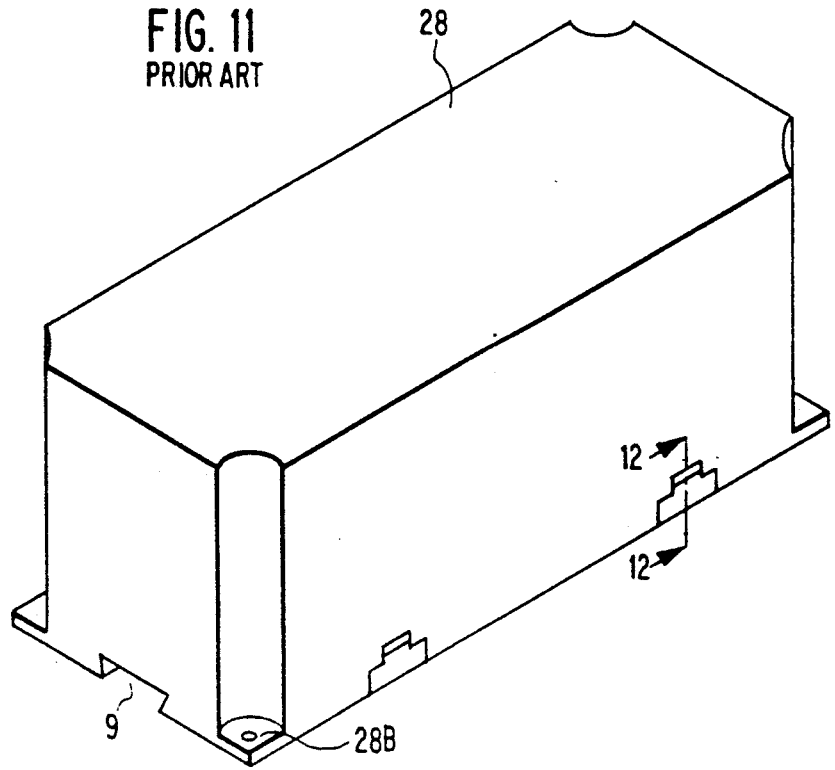
FIG. 11 is a perspective view of a conventional module 28.
Figure 13:
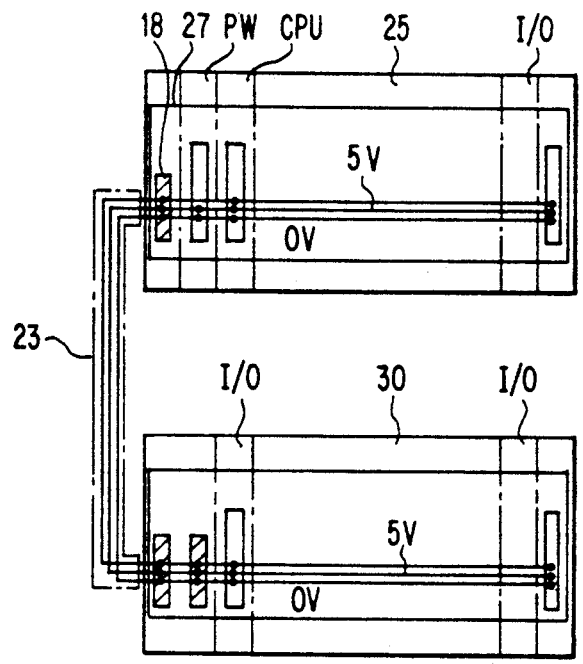
FIG. 13 shows cable connection in the vertical arrangement of the base unit and an extension base unit of the background art.
Figure 14:
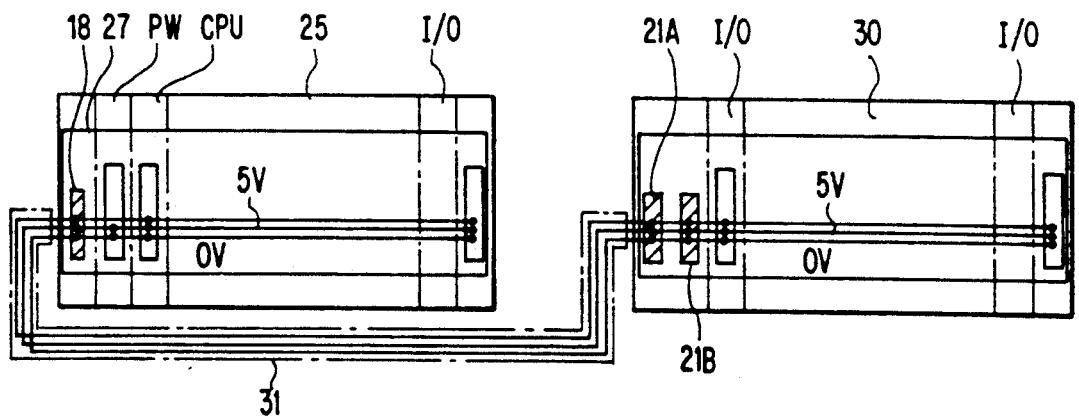
FIG. 14 shows cable connection in the horizontal arrangement of the base unit and the extension base unit of the background art.
Figure 15:
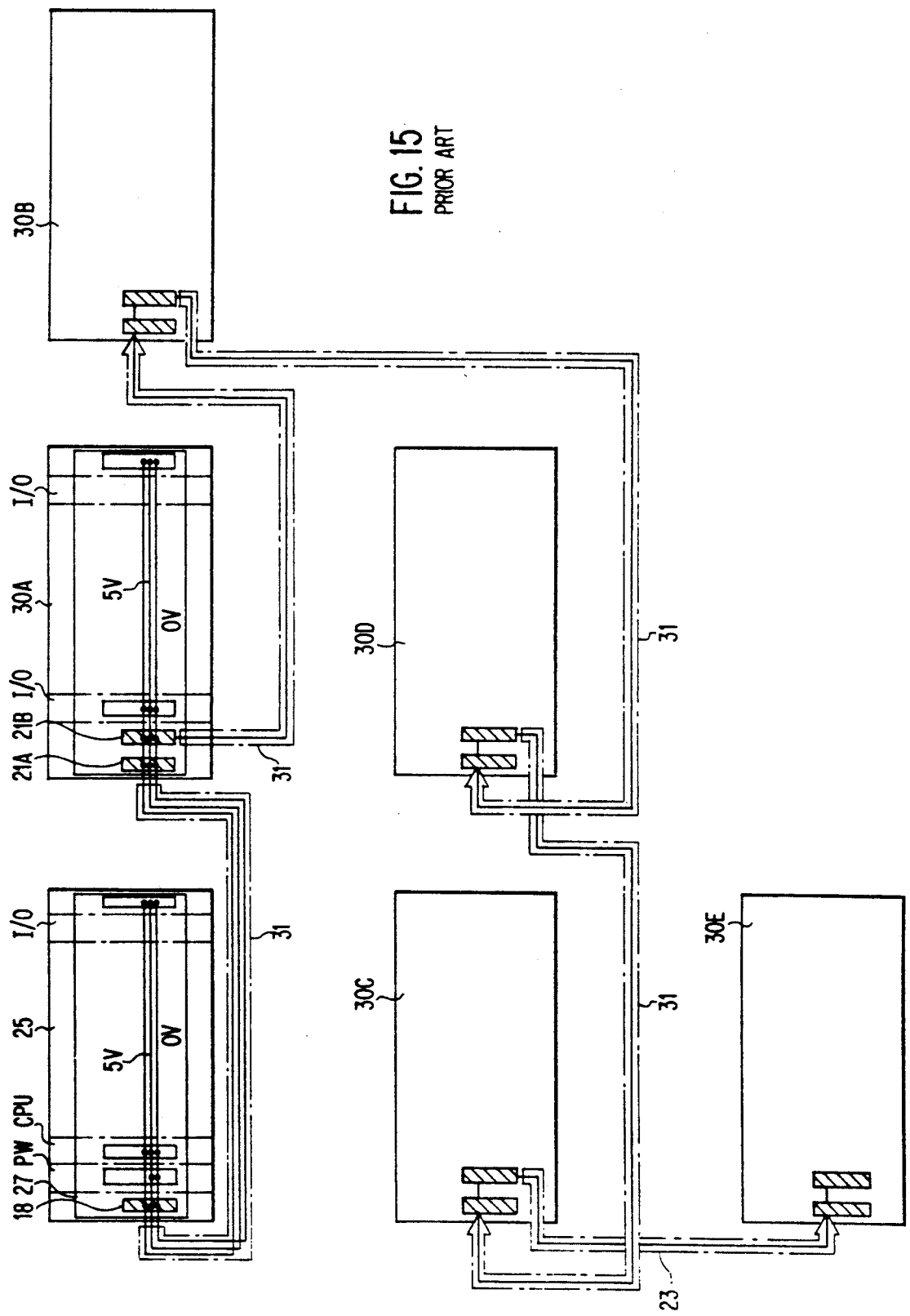
FIG. 15 shows cable connection of the background art in which extension base units are both horizontally and vertically installed.

A further embodiment of the invention will now be described with reference to FIG. 6 and FIGS. 7A and 7B. FIG. 6 shows the vertical (i.e., first orthogonal direction) arrangement of a base unit 1 and an extension base unit 20 having no power supply module. The units are connected by a cable (signal and power supply cable) 23 and a cable (power supply cable) 32 which extend from external connectors 18 and 19 disposed at opposite ends of the base unit 1. On the extension base unit 20 is a pair of extension connectors 21A and 21B at one end and an extension connector 22 at the opposite end. FIG. 7A shows a horizontal arrangement (i.e., a second orthogonal direction) of the two units 1 and 20, and 24 indicates a cable (signal and power supply cable) connecting them via external connectors 19 and 21A. FIG. 7B shows an arrangement where horizontal and vertical installations (two orthogonal directions) are mixed. The several units are connected in a vertical orientation by cables 23 (signal and power supply cable) and are connected in a horizontal orientation by cable 24 (signal and power supply cable).

In FIG. 6, the printed circuit board 15 is provided on its left-hand end with the connector 18 for connection with the extension base unit 20 and on its right-hand end with the connector 19, the connectors being connected by the patterns of 0V and 5V power supply lines and the signal line. As in the base unit 1, the extension base unit 20 without a power supply module also has similar power and signal lines that join the external connectors 21A and 21B on the left side and connector 22 on the right.

Between the base unit 1 and extension base unit 20, the power supply and signal lines are connected by the cable 23 from the connector 18 to the connector 21A. From the connector 19 to the connector 22, only the power supply lines are connected by the cable 32.

FIG. 7A illustrates an embodiment of the horizontal arrangement of the base unit 1 and extension base unit 20, wherein the base unit 1 and extension base unit 20 are connected by the cable 24 from the connector 19 to the connector 21A.

FIG. 7B illustrates an embodiment in which extension base units 20 are both horizontally and vertically installed. In the case of a horizontal installation, base unit 1 and extension base unit 20A are connected by cable 24 from connector 19 to connector 21A and extension base units 20A and 20B are connected with each other by cable 24 from connector 22 to connector 21A. All of these cable lengths are relatively short, extending from the right end of one unit to the left end of the other unit. Similarly in case of vertical installation, a base unit 1 and an extension base unit 20C are connected by cable 23 from connector 18 to connector 21A and extension base unit 20C is connected with extension base unit 20E by cable 23 from connector 21B on unit 20C to connector 21A on unit 20E. A horizontal connection, as described above, is made between units 20C and 20D. As is clear from this illustration, the unit design permits parallel, serial, side-by-side, top-to-bottom etc. connections of plural units with the use of a minimum amount of cable.

According to the embodiments as described above:

1. The chassis 2 is provided with the mold joining holes 4 and is molded integrally with the mold base 3 to offer ease of molding the complicated shape and dimensions of the DIN rail 10 mounting area. Also, the mold base 3 is formed to have slits 5 which mechanically divide the mold base 3 into a plurality of pieces, thereby protecting the mold base 3 from cracks and/or shape changes arising from temperature variations. Further, the mold base 3 employs therein a high strength chassis 2, thereby considerably improving warp and/or twist resistance in a width-wise or transverse dimension. It will be recognized that the slits 5 for separating the mold base 3 into a plurality of pieces may be gaps reaching the core chassis 2 or may extend only partially toward chassis 2, leaving relatively thin walls in the direction of mold base 3 thickness.

2. As opposed to the conventional art base unit which is exclusively used for panel mounting with mounting holes, the rear surface of the mold base 3 is provided with the DIN rail groove 9 and hooks 11 for installation to and removal from the DIN rail 10 to allow the base unit 1 to be mounted to the DIN rail 10 as well as to a panel, expanding the range of installation. Costly DIN-standard module structures and covers are not required.

3. Each hook assembly 11 is provided with a through hole 14 for a tool 13, whereby a plurality of hooks 11B provided in the base unit 1 can be simultaneously released from or secured to the DIN rail 10 by the tool 13, allowing the base unit 1 to be removed from the DIN rail 10 easily.

4. Instead of the screw fixing system known in the art, a sliding system is employed to install and remove the printed circuit board 15 to and from the mold base 3, thereby reducing installation time and enhancing workability and serviceability.

5. The parallel connection of the power supply lines between the base unit 1 and extension base unit 20 reduces the voltage drop across the extension cables 23 and 32 used for vertical connections, as compared to the drop experienced in the background art. Similarly, in the horizontal arrangement as shown in FIG. 7A, the cable 24 which is short in length and small in voltage drop can be used in place of the cable 31 in the background art, allowing the extension base unit 20 to employ I/O modules that consume more current than those on the extension base unit 30 of the background art. Similar advantages can be obtained for side-by-side arrangements.

The entire disclosure of each and every foreign patent application from which the benefit of foreign priority has been claimed in the present application is incorporated herein by reference, as if fully set forth.

Although this invention has been described in at least one preferred form with a certain degree of particularity, it is to be understood that the present disclosure of the preferred embodiment has been made only by way of example and that numerous changes in the details and arrangement of components may be made without departing from the spirit and scope of the invention as hereinafter claimed.

What is claimed is:

1. A controller base unit, including a printed circuit board- having a longitudinal dimension and being printed with connection lines between at least two connectors disposed along said longitudinal dimension for integrally accommodating controller modules modularized on a function basis, comprising:
a chassis, comprising a first material with a first coefficient of thermal expansion, having a planar surface with a plurality of through holes formed therein; and
a mold base, comprising a second material which is moldable and has a coefficient of thermal expansion different from said first material, said mold base being integrally formed with said chassis by distribution of said second material around at least a portion of said chassis and within said through holes, and said mold base being formed with slits for thermally separating said base material into a plurality of segments.

2. A controller base unit as defined in claim 1, wherein said controller is mountable to a support rail and said mold base comprises a rail groove structure for releasably mating to said support rail.

3. The controller base unit as defined in claim 2, wherein said chassis is operative to provide structural support to at least a portion of said rail groove.

4. The controller base unit as defined in claim 2, wherein said rail groove structure further comprises a spring loaded hook apparatus having a plurality of hooks for releasably securing said base to said rail.

5. The controller base unit as defined in claim 1, wherein the mold base has in its rear surface a DIN rail groove for installation onto a DIN rail and comprises DIN rail installation and removal hook apparatus for installably and removably fixing said base unit to said DIN rail, said apparatus comprising a plurality of installation and removal hooks, elastic means for slidably pressing said DIN rail installation and removal hooks against said DIN rial, and sliding grooves for guiding simultaneous sliding movement of said DIN rail installation and removal hooks.

6. The controller base unit as defined in claim 5, wherein each of the DIN rail installation and removal hooks has a projection protruding externally from the side face of the mold base and a tool-through hole formed adjacent to said projection for pulling the base unit out of the DIN rail against the elastic force of the elastic means pressing said DIN rail installation and removal hoods against said DIN rail.

7. The controller base unit as defined in any one of claims 1, 4, or 5, wherein said printed circuit has along said longitudinal dimension thereof at least one of tab means and cutout means and said mold base has in a first planar surface thereof a recess formed for accommodating said printed circuit board, said recess having in its periphery at least one of cutout means and tab means corresponding to said tab means and cutout means provided on said printed circuit board, and a clearance for sliding and securing said printed circuit board being provided between said tab means and a surface of said recess for accommodating said printed circuit board.

8. The controller base unit as defined in claim 7, wherein said board and said mold base have through holes disposed to be in alignment when said board is slid into a secured position and said unit further comprises securing means for passing into said through holes and securing said board and base against lateral movement.

9. A controller base unit, comprising:

a chassis;

a mold base being integrally formed with said chassis, said mold base being formed with slits for thermally separating said base material into a plurality of segments; and a printed circuit board having a longitudinal dimension and comprising a plurality of external connectors, at least a first and a second of said connectors being disposed at opposite ends of said longitudinal dimension, respectively, and connection lines between said first and second connectors for integrally accommodating controller modules modularized on a function basis, wherein said first and second external connectors are operative to connect to external power and signal cable, respectively.

10. The controller unit as defined in claim 9, further comprising a third external connector, said third connector being disposed at a position adjacent to one of said first or second connectors.

11. The controller base unit as defined in any of claims 1, 4, or 5, wherein said mold base accommodates the printed circuit board in the front surface thereof and said printed circuit board includes at each of opposite longitudinal ends thereof at least one external connector connectible with either side of a separately disposed extension controller base unit via a cable.

12. The controller base unit as defined in claim 11, wherein at least two of said external connectors is disposed at one longitudinal end of said printed circuit board.

13. A controller comprising a plurality of base units, including a first unit and a plurality of second units, each of said units comprising;

a chassis;

a mold base being integrally formed with said chassis, said mold base being formed with slits for thermally separating said base material into a plurality of segments; and a printed circuit board having a longitudinal dimension and comprising a plurality of external connectors, at least a first and a second of said connectors being disposed at opposite ends of said longitudinal dimension, respectively, and connection lines between said first and second connectors for integrally accommodating controller modules modularized on a function basis; and cable means for externally connecting at least one of said first external connectors of one unit to at least one of said second external connectors of another unit, wherein said first and second external connectors are operative to connect to external power and signal cable, respectively.

14. The controller as defined in claim 13, wherein said units are assembled on a planar surface and said cable means connections between adjacent units, organized horizontally with their longitudinal dimensions substantially colinear along a first orthogonal direction, are minimized.

15. The controller as defined in claim 13, wherein said units are assembled on a planar surface and said cable means connections between adjacent units, organized vertically with their longitudinal dimensions substantially in parallel along a second orthogonal direction, are minimized.

* * * * *